(12) United States Patent
Han et al.

(10) Patent No.: US 8,178,961 B2
(45) Date of Patent: May 15, 2012

(54) SEMICONDUCTOR PACKAGE STRUCTURE AND PACKAGE PROCESS

(75) Inventors: Ingyu Han, Kyunggi-Do (KR);
Seokbong Kim, Kyunggi-Do (KR);
Yuyong Lee, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 185 days.

(21) Appl. No.: 12/767,978

(22) Filed: Apr. 27, 2010

(65) Prior Publication Data

US 2011/0260266 A1    Oct. 27, 2011

(51) Int. Cl.
*H01L 23/02*    (2006.01)

(52) U.S. Cl. ............. 257/686; 257/E23.031; 257/676; 257/685; 257/777; 438/108; 438/109

(58) Field of Classification Search ........... 257/E29.324, 257/E23.031, E23.116, E21.502, E21.506, 257/E31.11, 100, 415, 433, 666, 667, 676, 257/692, 734, 723, 685, 686, 777; 438/107, 438/108, 109, 110, 123, 124

See application file for complete search history.

(56) References Cited

U.S. PATENT DOCUMENTS

| | | | |
|---|---|---|---|
| 6,254,815 B1 * | 7/2001 | Cheperak | 264/135 |
| 6,927,482 B1 * | 8/2005 | Kim et al. | 257/670 |
| 7,157,312 B2 * | 1/2007 | Kim et al. | 438/123 |
| 7,282,786 B2 * | 10/2007 | Jung et al. | 257/666 |
| 7,582,954 B1 * | 9/2009 | Lim et al. | 257/666 |
| 7,675,145 B2 * | 3/2010 | Wong et al. | 257/676 |
| 7,701,048 B2 * | 4/2010 | Lee et al. | 257/691 |
| 7,759,155 B2 * | 7/2010 | De Pauw | 438/64 |
| 2005/0082690 A1 * | 4/2005 | Hayashi et al. | 257/788 |
| 2007/0132112 A1 * | 6/2007 | Ozaki et al. | 257/787 |

* cited by examiner

*Primary Examiner* — Chris Chu
(74) *Attorney, Agent, or Firm* — J.C. Patents

(57) ABSTRACT

A semiconductor package structure and a package process are provided, wherein a lower surface of a die pad of a leadframe is exposed by an encapsulant so as to improve the heat dissipation efficiency of the semiconductor package structure. In addition, two chips are disposed at the same sides of the leadframe and the end portion of each of leads bonding to the upper chip is encapsulated by the encapsulant such that the scratch on the lead tips in wire bonding and die attach steps can be prevented and thus the wire bondability can be enhanced.

14 Claims, 6 Drawing Sheets

SEMICONDUCTOR PACKAGE STRUCTURE AND PACKAGE PROCESS

BACKGROUND

1. Field of the Application

The present application generally relates to a semiconductor package structure and a package process. More particularly, the present application relates to a multi-chip semiconductor package structure and a package process thereof.

2. Description of Related Art

With ever increasing demands for miniaturization and higher operating speeds, semiconductor package structures having a plurality of chips, i.e., multi-chip modules (MCMs), are increasingly attractive in a variety of electronics. MCMs which contain more than one die can help minimize the system operational speed restrictions imposed by long printed circuit board connection traces by combining, for example, the processor, memory, and associated logic into a single package. In addition, MCMs decrease the interconnection length between IC chips thereby reducing signal delays and access times.

However, in certain applications (e.g., tire pressure monitoring systems (TPMS) for monitoring the pressure in automotive tires), it is desirable to have one chip, e.g., a sensor chip separate from other integrated circuit chips for reasons of functionality, reliability, safety, and/or manufacturability. TPMS typically include a sensor chip for sensing tire pressure and an application specific integrated circuit (ASIC) chip responsive to temperature and system battery voltage.

Conventional TMPS have been packaged in a variety of ways. However, they always suffer in low heat dissipation efficiency and poor wire bondability due to scratch on the lead tips during the strip feeding for the ASIC chip in wire bonding and die attach steps.

SUMMARY

Accordingly, the present application is directed to a semiconductor package structure and a package process which overcomes, or at least reduces the above-mentioned problems of the related art.

As embodied and broadly described herein, the present application provides a semiconductor package structure comprising a leadframe, a first chip, a first encapsulant, a second chip and a cover. The leadframe has a die pad and a plurality of first and second leads arranged around the die pad. The first chip is disposed on an upper surface of the die pad and electrically connected to the first and second leads. The first encapsulant encapsulates the first chip, the upper surface of the die pad and at least a portion of each of the first and second leads. The first encapsulant exposes a lower surface of the die pad and has a cavity exposing a first bonding area of each of the second leads. The first encapsulant further encapsulates an end portion of each of the second leads extending toward the die pad. The second chip is disposed in the cavity of the first encapsulant and electrically connected to the first bonding areas of the second leads. The cover is disposed over the cavity of the first encapsulant.

The present application further provides a package process comprising: providing a leadframe having a die pad and a plurality of first and second leads arranged around the die pad; disposing a first chip onto an upper surface of the die pad; electrically connecting the first chip to the first and second leads; encapsulating the first chip, the upper surface of the die pad and at least a portion of each of the first and second leads in a first encapsulant having a cavity exposing a first bonding area of each of the second leads, wherein at least a portion of the first encapsulant is formed to cover the first chip on the die pad, the first encapsulant exposes a lower surface of the die pad, and the first encapsulant further encapsulates an end portion of each of the second leads extending toward the die pad; mounting a second chip in the cavity of the first encapsulant and directly upon the portion of the first encapsulant on the first chip; electrically connecting the second chip to the first bonding areas of the second leads; and, disposing a cover over the cavity of the first encapsulant.

As to the above, the lower surface of the die pad is exposed by the first encapsulant so as to improve the thermal performance such as heat dissipation efficiency of the semiconductor package structure. In addition, the two chips are disposed at the same sides of the leadframe and the end portion of each of the leads is encapsulated by the encapsulant such that the scratch on the lead tips in wire bonding and die attach steps can be prevented and thus the wire bondability can be enhanced.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF THE EMBODIMENTS

Figure 1A:
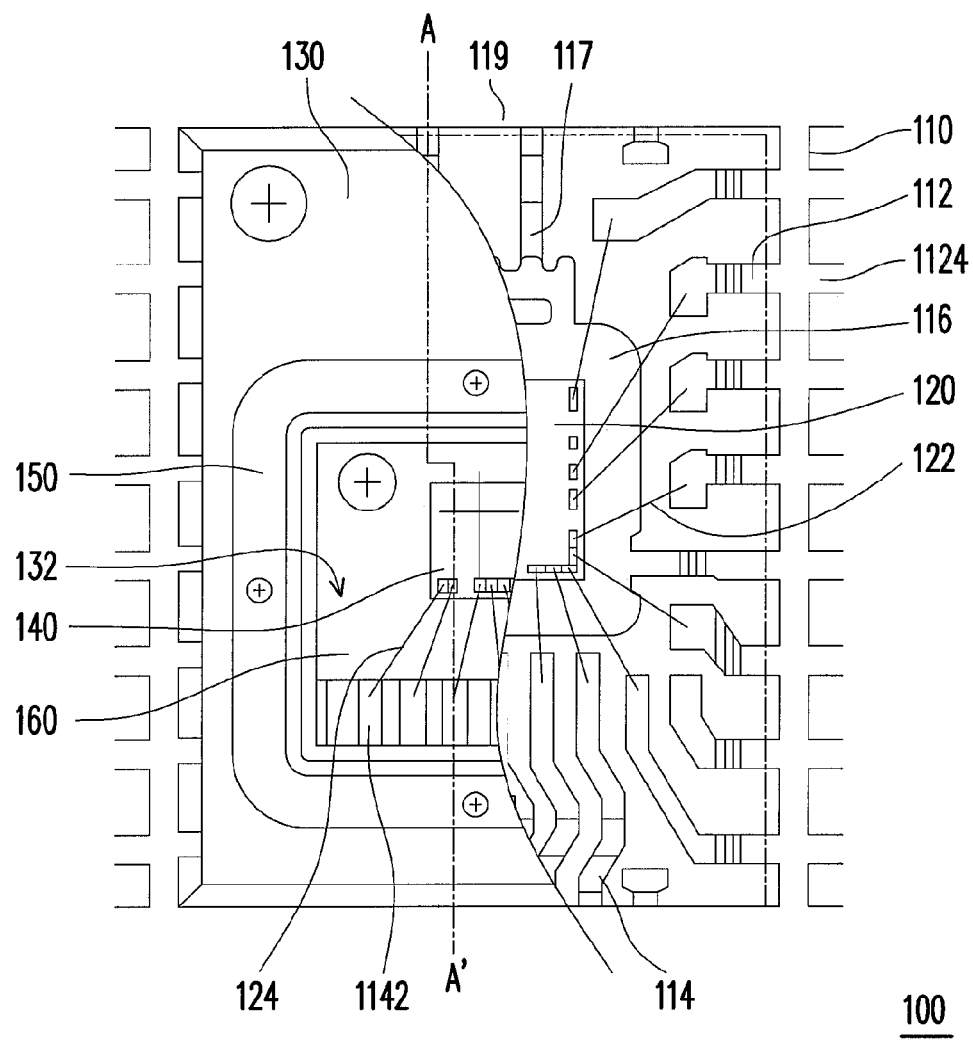
FIGS. 1A and 1B illustrate a semiconductor package structure according to an embodiment of the present application.

Reference will now be made in detail to the present preferred embodiments of the application, examples of which are illustrated in the accompanying drawings. Wherever possible, the same reference numbers are used in the drawings and the description to refer to the same or like parts.

Figure 1B:
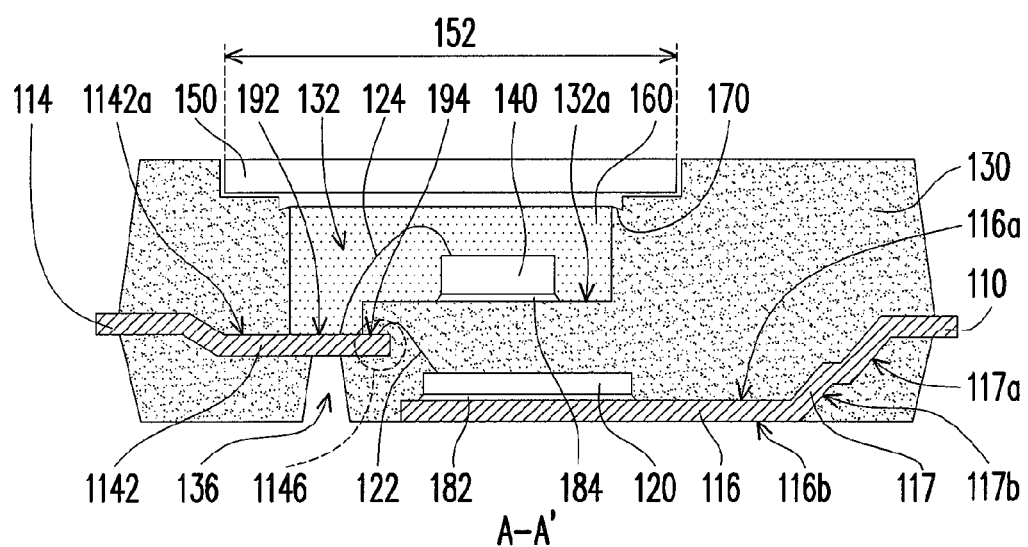

FIGS. 1A and 1B illustrate a semiconductor package structure 100 according to an embodiment of the present application. FIG. 1A shows a top view of the semiconductor package structure 100. FIG. 1A further shows an internal part of the semiconductor package structure. FIG. 1B is a cross-sectional view taken along line A-A' of FIG. 1A.

Referring to FIGS. 1A and 1B, the semiconductor package structure 100 mainly includes a leadframe 110 and a first chip 120 encapsulated in a first encapsulant 130 having a cavity 132 for receiving a second chip 140, and a cover 150 disposed over the cavity 132 of the first encapsulant 130 For example, the first chip 120 may be a discrete device, an integrated circuit, or a control chip, and the second chip 140 may be a sensor that is to be exposed to the environment, e.g., a chemical sensor, a pressure sensor, a temperature sensor, an optical sensor, a velocity sensor, or an accelerometer. Alternatively, the second chip 140 may be a surface acoustic wave (SAW) device, or another chip. The cover 150 preferably has an aperture 152 for expose the second chip 140 to ambient conditions, as is required for some types of electronic chips such as, for example, at least some of the sensors described above. The aperture 152 in the cover 150 is preferably sized for allowing the sensor (that is to be exposed to the environment) to communicate with the environment exterior to the semiconductor package structure and at the same time to prevent infiltration of contaminants into the cavity 132.

The leadframe 110 includes a plurality of first and second leads 112, 114 arranged around a die pad 116. The leadframe 110 may be made of a copper-base alloy or made of copper or alloys containing copper. Leadframes suitable for use in the present application are available in three lead finishes: post plated SnPb, Matte Sn, and pre plated Ni/Pd with flash of Au (i.e., PPF (Pre-Plating Leadframe)). The first and second leads 112, 114 are all connected to a dam bar 119 (not shown). The die pad 116 is connected to the dam bar 119 via tie-bars 117.

The first chip 120 is securely attached to an upper surface 116a of the die pad 116 via an adhesive 182 such as silver epoxy or other nonconductive adhesives, and electrically connected to the first leads 112 and the second leads 114 via a plurality of bonding wires 122. The first chip 120 is encapsulated in the first encapsulant 130 for moisture resistance and shock resistance. The first encapsulant 130 also encapsulates the upper surface 116a of the die pad 116 and at least a portion of each of the first and second leads 112, 114.

The first bonding area 192 on the upper surface 1142a of the inner lead portion 1142 of each of the second leads 114 is exposed in the cavity 132 for electrically connecting to the second chip 140 via a plurality of bonding wires 124. In addition, each of the second leads 114 further has a second bonding area 194 on an upper surface 1142a of the inner lead portion 1142 of each of the second leads 114 and located at the end portion 1146 of the second lead 114 extending toward the die pad 116. The first chip 120 is electrically connected to the second bonding areas 194 of the second leads 114.

Note that both of the first bonding area 192 and the second bonding area 194 are located on the upper surface 1142a of the inner lead portion 1142 of each of the second leads 114. Additionally, the inner lead portion 1142 of each of the second leads 114 is downwardly set, such that the first bonding area 192 and the second bonding area 194 of each of the second leads 114 are lower than other portion of the second lead 114. And, the first encapsulant 130 also encapsulates the end portion 1146 of each of the second leads 114 and the second bonding area 194 thereon.

Each of the tie bars 117 is downwardly set together with the second leads 114 to form a first down-set portion 117a, and furthermore, each of the tie bars 117 is further downwardly set by another down-set step to form a second down-set portion 117b. Accordingly, the die pad 116 connecting the tie bars 117 is lower than the first bonding area 192 and the second bonding area 194 of each of the second leads 114, and a lower surface 116b of the die pad 116 can be exposed by the first encapsulant 130. Therefore, the thermal performance such as heat dissipation efficiency of the semiconductor package structure 100 can be improved by exposing the lower surface 116b of the die pad 116.

The first leads 112 respectively has an outer lead portion 1124 extending outwardly of the first encapsulant 130 from the lateral sides, which, in turn, can be formed into standard lead configurations.

The second chip 140 is securely attached to a bottom surface 132a of the cavity 132 via an adhesive 184 such as silver epoxy or other nonconductive adhesives, and electrically connected to the second leads 114 via the bonding wires 124. In addition, a flexible gel is applied into the cavity 132 to form a second encapsulant 160 covering the second chip 140. In this embodiment, a stopper structure 170 is preferably formed in the walls of the first encapsulant 130 erected around the cavity 132 for preventing the second encapsulant 160 from overflowing out of the cavity 132.

Note that at least a portion of the first encapsulant 130 is formed between the second chip 140 and the die pad 116 such that the second chip 140 is directly disposed on the portion of the first encapsulant 130 instead of the die pad 116. Since the encapsulant 130 typically has a CTE substantially equal to the second chip 140, the aforementioned design can significantly reduce problems of delamination between the second chip 140 and the die pad 116, chip warpage or even die cracking.

Moreover, the both of the first chip 120 and the second chip 140 are disposed at the same side of the die pad 116, and the end portion 1146 of each of the second leads 114 and the second bonding area 194 thereon are encapsulated by the first encapsulant 130, such that the scratch on the end portion 1146 of each of the second leads 114 in wire bonding and die attach steps can be prevented and thus the wire bondability can be enhanced.

The first encapsulant 130 is formed by a conventional molding process such as transfer molding. During the molding process, the leadframe 110 is held in position by upper and lower mold chases (not shown) that together define a molding cavity shaped generally to conform to the first encapsulant 130. The lower mold chase is preferably provided with a fixture pin for supporting the inner lead portions 1142 of the second leads 114 thereby preventing undesired mold flash on the exposed upper surfaces 1142a. The fixture pin will result in the formation of a hole 136 in the first encapsulant 130.

In one embodiment, the semiconductor package structure of the application may be used in a tire pressure measurement system (TPMS) (not shown). In this embodiment, the chip 120 may be an application specific integrated circuit (ASIC), and the second chip 140 may be a pressure sensor chip. Preferably, the encapsulant for forming the second encapsulant 160 has sufficient flexibility to allow the sensor chip to be responsive to changes in ambient pressure. Preferably, the outer lead portions 1124 of the first leads 112 are designed to be compatible with existing standardized TPMS.

Although the present application is discussed in detail with respect to the semiconductor package structure 100 with two chips, a semiconductor package structure with more than two chips is still considered within the spirit and scope of the application.

The present application further provides a package process for making the aforementioned semiconductor package structure. FIGS. 2A through 2D illustrate the package process according to an embodiment of the present application.

Figure 2A:
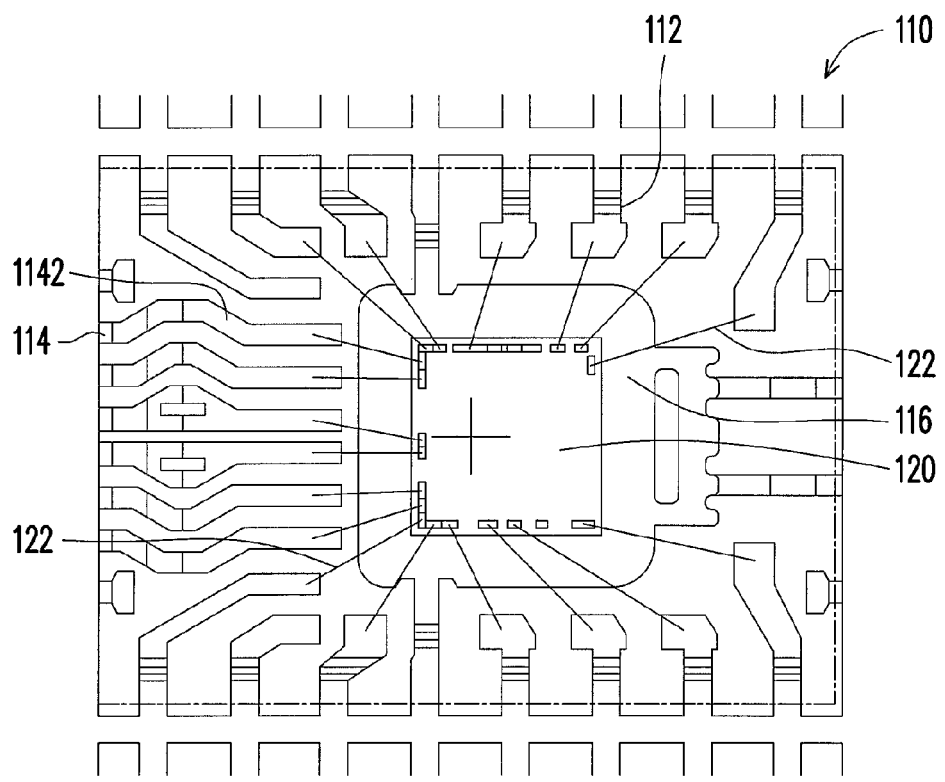
FIGS. 2A through 2D illustrate the package process according to an embodiment of the present application.
Figure 2A:
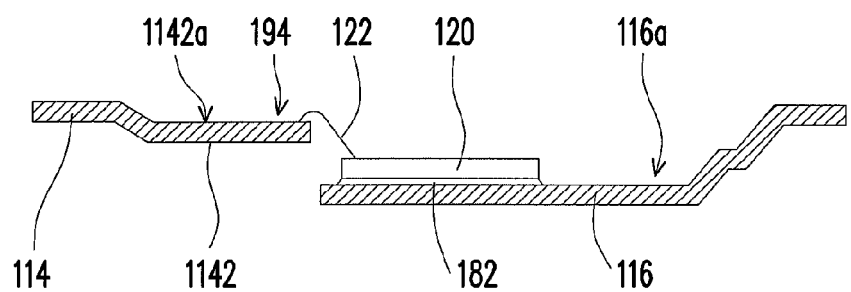

Firstly, as shown in FIG. 2A, the leadframe 110 having the die pad 116, the first leads 112 and the second leads 114 is provided. The first chip 120 is bonded onto the upper surface 116a of the die pad 116 via the adhesive 182 such as silver epoxy or other nonconductive adhesives, and electrically connected to the first leads 112 and the second leads 114 via the bonding wires 122, wherein the first chip 120 is electrically connected to the second bonding area 194 on an upper surface 1142a of the inner lead portion 1142 of each of the second leads 114.

Figure 2B:
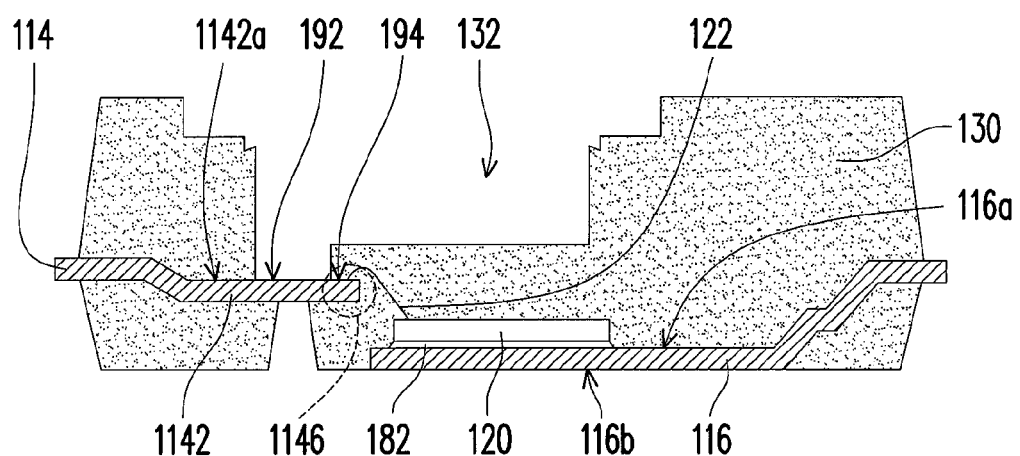

Then, referring to FIG. 2B, The first encapsulant 130 is formed to encapsulate the first chip 120, the upper surface 116a of the die pad 116 and at least a portion of each of the first and second leads 112 and 114. The first encapsulant 130 has the cavity 132 exposing the first bonding area 192 of each of the second leads 114, wherein at least a portion of the first encapsulant 130 is formed to cover the first chip 120 on the die pad 116. The first encapsulant 130 further exposes the lower surface 116b of the die pad 116, and encapsulates the end portion 1146 of each of the second leads 114 and the second bonding area 194 thereon.

Figure 2C:
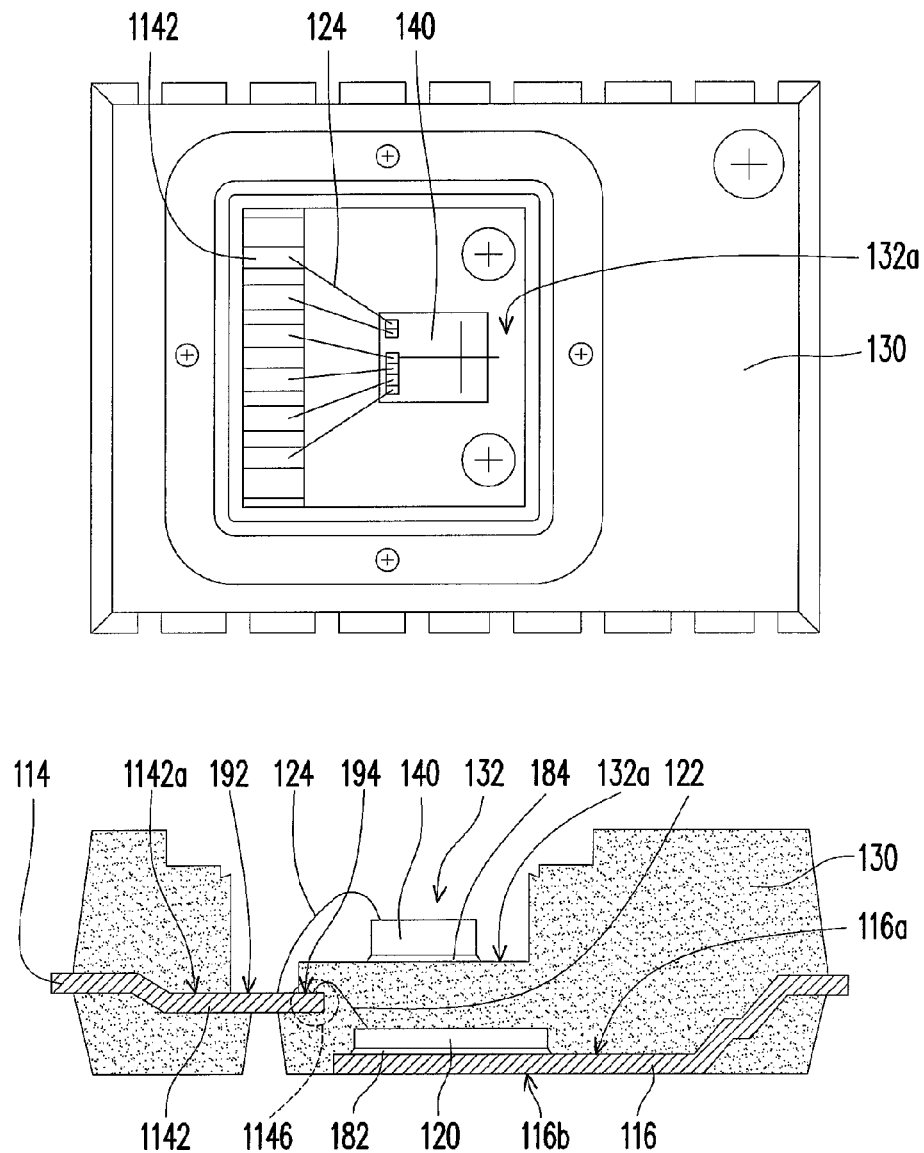

Next, referring to FIG. 2C, the second chip 140 is securely attached to a bottom surface 132a of the cavity 132 directly upon the portion of the first encapsulant 130 on the first chip 120 via an adhesive 184 such as silver epoxy or other nonconductive adhesives, and electrically connected to the first bonding area 192 of each of the second leads 114 via the bonding wires 124.

Figure 2D:
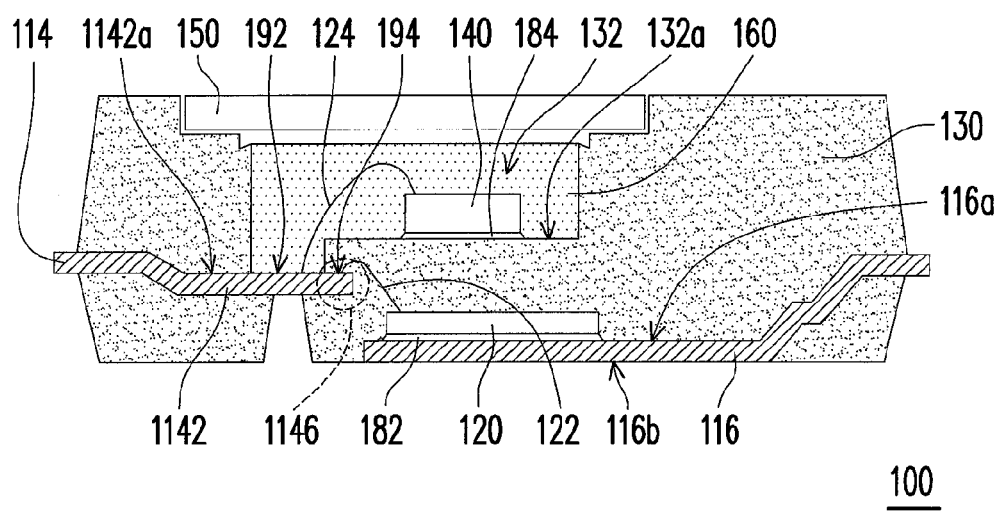

Then, referring to FIG. 2D, the second encapsulant 160 is formed in the cavity 132 of the first encapsulant 130 to encapsulate the second chip 140. And, the cover 150 is disposed over the cavity 132 of the first encapsulant 130.

In mass production, it is desirable to integrally form a plurality of leadframe units in a leadframe strip so that a plurality of semiconductor package structures can be manufactured simultaneously. In the aforementioned embodiments, a singulation step is conducted after the step as shown in FIG. 2D to complete the packaging process.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims and their equivalents.

What is claimed is:

1. A semiconductor package structure, comprising:
   a leadframe, having a die pad and a plurality of first and second leads arranged around the die pad;
   a first chip, disposed on an upper surface of the die pad, the first chip being electrically connected to the first and second leads;
   a first encapsulant, encapsulating the first chip, the upper surface of the die pad and at least a portion of each of the first and second leads, the first encapsulant exposing a lower surface of the die pad, the first encapsulant having a cavity exposing a first bonding area of each of the second leads, and the first encapsulant further encapsulating an end portion of each of the second leads extending toward the die pad;
   a second chip, disposed in the cavity of the first encapsulant and electrically connected to the first bonding areas of the second leads; and
   a cover, disposed over the cavity of the first encapsulant.

2. The semiconductor package structure according to claim 1, further comprising an adhesive, wherein the second chip is disposed on a bottom surface of the cavity of the first encapsulant via the adhesive.

3. The semiconductor package structure according to claim 1, further comprising a second encapsulant disposed in the cavity of the first encapsulant for encapsulating the second chip.

4. The semiconductor package structure according to claim 3, wherein the first encapsulant includes a stopper ring trench formed in a sidewall of the cavity and surrounding the second encapsulant.

5. The semiconductor package structure according to claim 1, wherein the second chip is a sensor chip, and the cover has an aperture for allowing the sensor chip to communicate with the environment outside the semiconductor package structure.

6. The semiconductor package structure according to claim 5, wherein the second chip is a chemical sensor, a pressure sensor, a temperature sensor, an optical sensor, a velocity sensor, a surface acoustic wave (SAW) device , or an accelerometer.

7. The semiconductor package structure according to claim 1, wherein each of the second leads is provided with the first bonding area and a second bonding area, both of the first bonding area and the second bonding area are disposed on an upper surface of the second lead, the second bonding area is located at the end portion of the second lead and encapsulated by the first encapsulant, and the first chip is electrically connected to the second bonding area.

8. The semiconductor package structure according to claim 1, wherein the first bonding area and the second bonding area of each of the second leads are downwardly set to be lower than other portion of the second lead.

9. The semiconductor package structure according to claim 8, wherein the die pad is downwardly set to be lower than the first bonding area and the second bonding area of each of the second leads, and the lower surface of the die pad exposed by the first encapsulant.

10. The semiconductor package structure according to claim 1, further comprising a hole within in the first encapsulant and corresponding to the second leads.

11. The semiconductor package structure according to claim 10 ,wherein the hole is corresponding to the first bonding area of the second leads.

12. The semiconductor package structure according to claim 1, wherein the second chip is electrically connected to the first bonding areas of the second leads via a plurality of wires.

13. The semiconductor package structure according to claim 1, further comprising a gap between the cover and the second encapsulant.

14. The semiconductor package structure according to claim 7, wherein the first chip is electrically connected to the second bonding areas of the second leads and to the first leads via a plurality of wires.

* * * * *